United States Patent
Kamiya

(10) Patent No.: US 6,522,512 B1
(45) Date of Patent: Feb. 18, 2003

(54) ANTI-LATCH-UP CIRCUIT

(75) Inventor: Hiroshi Kamiya, Tokyo (JP)

(73) Assignee: NEC Corporation, Tokyo (JP)

( * ) Notice: Subject to any disclaimer, the term of this patent is extended or adjusted under 35 U.S.C. 154(b) by 172 days.

(21) Appl. No.: 09/714,209

(22) Filed: Nov. 17, 2000

(30) Foreign Application Priority Data

Nov. 24, 1999 (JP) ............................. 11-332384

(51) Int. Cl.[7] ............................. H02H 7/00; H02H 3/22
(52) U.S. Cl. ..................... 361/56; 361/111; 327/382; 326/83
(58) Field of Search ................. 361/54, 56, 111, 361/91.1, 91.3, 93.3, 98; 327/365, 379–382, 545, 546; 326/82, 83

(56) References Cited

U.S. PATENT DOCUMENTS

| | | | | |
|---|---|---|---|---|
| 5,546,020 A | * | 8/1996 | Lee et al. ....................... | 326/83 |
| 5,771,140 A | * | 6/1998 | Kim ............................. | 361/111 |
| 5,905,621 A | * | 5/1999 | Drapkin ........................ | 361/111 |
| 6,060,906 A | * | 5/2000 | Chow et al. .................. | 326/121 |
| 6,130,812 A | * | 10/2000 | Corvasce et al. ............ | 307/127 |

* cited by examiner

*Primary Examiner*—Kim Huynh
(74) *Attorney, Agent, or Firm*—Sughrue Mion, PLLC

(57) ABSTRACT

An anti-latch-up circuit for a signal-reception device has a voltage source activated separately from a signal-transmission device. A diode connected between the voltage source and the signal-reception device becomes forward-biased when an overvoltage in excess of the voltage of the voltage source is applied to the input of the signal reception device. A buffer circuit connected to the voltage source provides an output of a first logic level or a second logic level in response to the turn-off state or turn-on state, respectively, of the voltage source. The output of the buffer circuit is connected to an output control circuit to block the signal-transmission device from providing an output when the buffer circuit provides an output of the first logic level and permits the signal-transmission device to provide an output when the buffer circuit provides an output of the second logic level.

6 Claims, 2 Drawing Sheets

ANTI-LATCH-UP CIRCUIT

BACKGROUND OF THE INVENTION

Field of the Invention

The present invention relates to an anti-latch-up circuit, particularly to an anti-latch-up circuit in a separate-source connection.

FIG. 1 represents a schematic illustration of a conventional anti-latch-up circuit in a separate-source connection. Here, the separate-source connection refers to a circuit configuration such that an electronic circuit is powered by a voltage source separate from the power source of the main circuit to which the electronic circuit belongs.

In the figure, diode 7 and voltage source 3 make up the anti-latch-up circuit and voltage source 3 is a separate source. Other circuit elements are constituents of the main circuit, where p-MOS transistor 4 and n-MOS transistor 5 constitute a CMOS inverter that serves as an output buffer. The output buffer (4, 5) is powered by a voltage source for the transmission device 2 with the source of p-MOS transistor 4 connected to voltage source 2 and the source of n-MOS transistor being grounded. The output buffer (4, 5) supplies an output signal from output point 6 of the CMOS output buffer (the junction between the drains of p-MOS transistor 4 and n-MOS transistor 5). Hereinafter, voltage source 2 will be referred to as a transmission-side voltage source and voltage source 3 as an anti-latch-up voltage source.

Output buffer (4, 5) supplies an output signal to a reception device 9 which is symbolically represented as input buffer 9 in FIG. 1.

The anti-latch-up circuit made up of diode 7 and anti-latch-up voltage source 3 is arranged at an input section 8 of reception device 9 to protect it from a high-voltage noise.

The voltage of anti-latch-up voltage source 3 is set up to be higher than that of transmission-side voltage source 2. Since the output signal of the CMOS inverter has a voltage level lower than or equal to that of transmission-side voltage source 2, diode 7 is always reverse-biased insofar as the circuit operates normally.

When, however, the input section 8 of the reception device 9 incidentally picks up a noise of a voltage level higher than that of anti-latch-up source 3, diode 7 is forward-biased. The current caused by the noise finds its way through forward-biased diode 7 to anti-latch-up source 3 to protect reception device 9 against the flow of the noise-induced current.

Should the anti-latch-up circuit made up of diode 7 and anti-latch-up source 3 not be provided and consequently the noise of a high voltage-level be received directly by reception device 9, the noise will be likely to cause creation of a high concentration carrier which is in turn injected into the substrate of reception device 9, thereby causing a latch-up to be triggered.

Accordingly, the anti-latch-up circuit serves to avoid triggering of a latch-up by conducting the noise-induced current to bypass reception device 9.

While the anti-latch-up circuit serves to protect reception device 9 against the latch-up due to a high-level noise as described above, a problem encountered in the conventional anti-latch-up circuit has been that a latch-up can be caused by diode 7 depending on the order in which the two voltage sources are turned on.

Suppose an initial state in which transmission-side voltage source 2 is turned on while anti-latch-up voltage source 3 is still on switch-off.

In many cases, the circuitry of anti-latch-up source 3 is configured so that the output of anti-latch-up voltage source 3 keeps the ground potential when the voltage source 3 is switched off.

Accordingly, diode 7 is forward-biased when output 6 of the output buffer (4, 5) is accidentally at a high logic level.

The forward bias occasionally causes an over-current to conduct through diode 7, possibly causing a high concentration carrier to be injected into the reception device 9. The injected high-concentration carrier tends to trigger a latch-up.

For this reason, diode 7 possibly causes a latch-up due to the sequence of the turn-on of the two voltage sources.

In order to avoid this disadvantage, the anti-latch-up circuit described above has been omitted in many practical cases.

However, while the omission of the anti-latch-up circuit will obviate occurrence of latch-up due to the over-current of diode 7, an alternative problem has been encountered that the omission of the anti-latch-up circuit unavoidably carries about vulnerableness to a latch-up due to an incoming high-level static noise, as described above.

It is an object of the present invention to provide an anti-latch-up circuit that is latch-up-resistant regardless of the order of switching-on of the two voltage sources.

SUMMARY OF THE INVENTION

The anti-latch-up circuit for protecting a signal-reception device from latch-up possibly triggered in the signal-reception device comprises a voltage source activated separately from a signal-transmission device, a diode, buffer means and an output-control circuit.

The diode is connected between the voltage source and the input conductor of the signal-reception device so as to become forward-biased when the overvoltage in excess of the voltage of the voltage source is applied to the input conductor.

The buffer means provides an output of a first logic level or a second logic level in response to turn-off or turn-on, respectively, of the voltage source.

The output control circuit checks the signal-transmission device to provide an output when the buffer means provides an output of the first logic level and permits the signal-transmission device to provide an output when the buffer means provides an output of the second logic level.

When the input conductor picks up a noise having a voltage level higher than that of the voltage source, the diode is forward-biased and a current caused by the noise flows to the voltage source without conducting into the signal-reception device.

In this way, the voltage source and the diode cooperate to prevent carrier injection into the signal-reception device, thereby preventing possible occurrence of latch-up in the signal-reception device.

When the signal-transmission device is turned on while the voltage source is turned off, the buffer means provides an output of the first logic level. This output of the buffer means causes the output control means to control the output buffer circuit to be blocked from transmission of a signal to the input conductor of the signal-reception device.

In this way, the buffer means and the output control means cooperate to block a signal transmission while the voltage source is turned off, thereby preventing triggering of latch-up caused by the signal transmission to the input conductor while turn-off of the voltage source.

The signal-transmission device can be provided with an output buffer circuit fed with an operating voltage from a power supply. In this case, the output control means is series-connected to the power-supply path from said power supply to the output buffer circuit to check or permit a power supply to the output buffer circuit.

Preferably, the output buffer circuit is a CMOS buffer circuit and the output control means is a p-MOS transistor with a source connected to the power supply, a drain connected to the upper source of the CMOS buffer circuit and a gate connected to the output of the buffer means. In this case, the first logic level is prescribed to be a high level and the second logic level is prescribed to be a low level.

The buffer means can be provided on the side of the signal-reception device.

Alternatively, buffer means can be provided on the side of the signal-transmission device.

The buffer means can be made up of buffer circuits of multiple stages.

The above and other objects, features and advantages of the present invention will become apparent from the following description referring to the accompanying drawings which illustrate an example of a preferred embodiment of the present invention.

DETAILED EXPLANATION OF THE PREFERRED EMBODIMENT

Figure 1:
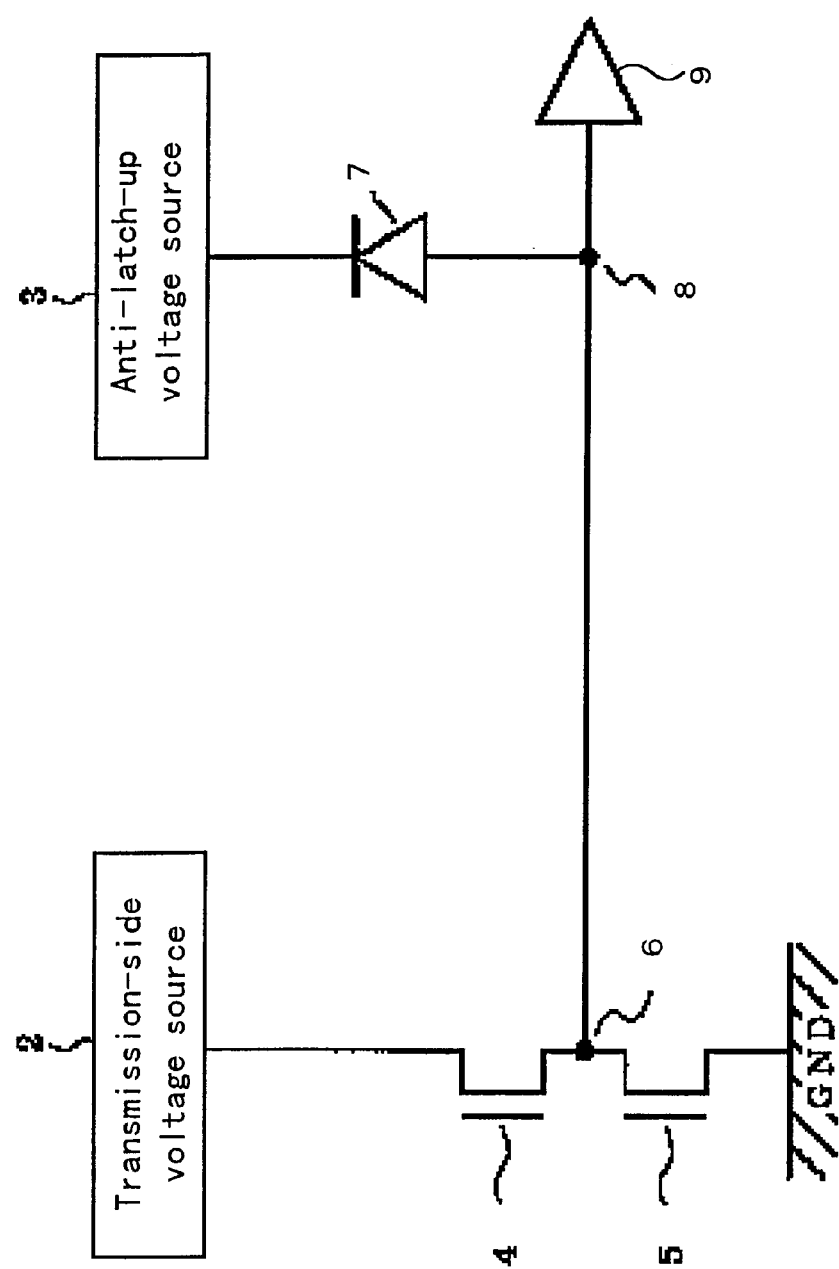
FIG. 1 represents a schematic illustration of a conventional anti-latch-up circuit in a separate-source connection.
Figure 2:
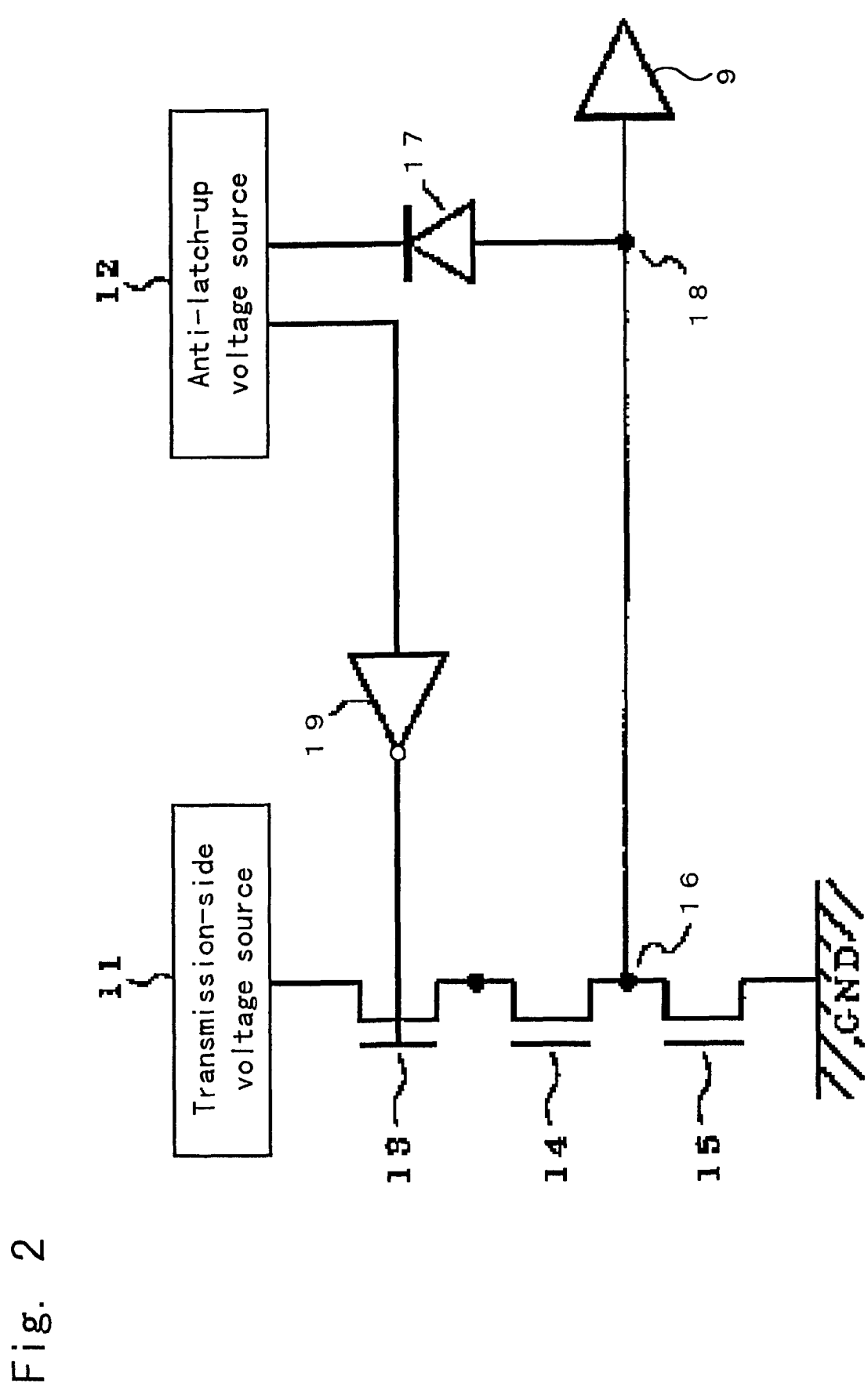
FIG. 2 is a schematic diagram illustrating a configuration of the anti-latch-up circuit in a separate-voltage connection according to the present invention.

FIG. 2 is a schematic diagram illustrating a configuration of the anti-latch-up circuit in a separate-voltage connection according to the present invention. As is shown in the figure, the anti-latch-up circuit is provided in a main circuit that has a transmission-side voltage source 11, a CMOS output buffer made up of p-MOS transistor 14 and n-MOS transistor 15 as a transmission device, and reception device 19 (symbolically represented with input buffer 19). The CMOS output buffer has the same circuitry as the CMOS output buffer illustrated with reference to FIG. 1.

The anti-latch-up circuit of the present embodiment comprises diode 17, anti-latch-up voltage source 12, buffer circuit 19 and p-MOS transistor 13. The p-MOS transistor 13 is connected in series with CMOS output buffer (14, 15) with the source thereof connected to transmission-side voltage source 11, the drain thereof connected to the source of p-MOS transistor 14 of the CMOS output buffer (14, 15) and the gate thereof connected to the output of buffer circuit 19. In this way, p-MOS transistor 13 serves as a switching transistor to switch the connection between transmission-side voltage source 11 and the CMOS output buffer (14, 15).

CMOS transistor (14, 15) supplies an output signal 16 to reception device 9.

Anti-latch-up voltage source 12 is provided with two output terminals: a first terminal and a second terminal. The voltage source 12 provides outputs of the ground potential at both the first and second terminals in the off-state.

In the on-state, the voltage source 12 provides, at the first terminal, an output of a first voltage set up to a value higher than that of the transmission-side voltage source 11, and also provides, at the second terminal, an output of a second voltage prescribed to adapt to an input voltage of buffer circuit 19.

The anode of diode 17 is supplied with output 16 of CMOS output buffer (14, 15), and the cathode thereof is connected to a first terminal for supplying the first voltage.

Buffer circuit 19 receives an input signal from a second terminal of anti-latch-up voltage source 12. The output of buffer circuit 19 is connected to the gate of p-MOS transistor 13, as described above.

In the above-described circuitry, suppose an initial state in which transmission-side voltage source 11 is turned on while anti-latch-up voltage source 12 is still in an off-state.

In this initial state, the voltage source 12 provides an output of the ground potential which causes the output of buffer circuit 19 to take the high logic level. The high logic level of the output of buffer circuit 19, when applied to the gate of the p-MOS transistor 13, causes p-MOS transistor 13 to switch off the connection between transmission-side voltage source 11 and CMOS output buffer (14, 15).

As a result, CMOS output buffer (14, 15) is prohibited from an output of a high voltage level. In this way, the forward-biasing of diode 17 and consequent triggering in reception device 9 are prevented.

In the above-described initial state, p-MOS transistor 13, p-MOS transistor 14 and n-MOS transistor 15 are placed in a metastable state which allows first p-MOS transistor 13 to be triggered to turn on upon the gate voltage thereof being brought into an active region.

The turn-on of anti-latch-up voltage source 12 causes the second voltage to be supplied from the voltage source 12 to buffer circuit 19 which in turn supplies a low level potential to the gate of p-MOS transistor 13. As a result, the electric potential of transmission-side voltage source 11 is supplied to p-MOS transistor 14 to make CMOS output buffer active.

As described above, the provision of the MOS transistor 13 for switching the connection between transmission-side voltage source 11 and CMOS output buffer and also the provision of buffer circuit 19 between the anti-latch-up voltage source 12 and the gate of the MOS transistor 13 block a rise of latch-up even when diode 17 is provided between the input section (input conductor) 18 of the reception device and the anti-latch-up voltage source 12.

In this way, the circuit configured by the buffer circuit 19 and the MOS transistor 13 as well as diode 17 and anti-latch-up voltage source 12 serves as an anti-latch-up circuit capable of deferring a rise of latch-up caused by either the turn-on of the transmission-side voltage source while switching-off of the anti-latch-up voltage source or by pickup of a noise of a high voltage level in the input section 18 of the reception device.

It is to be noted that, while buffer circuit 19 is provided on the transmission side in the present embodiment, it can be provided on the reception side. It is also to be noted that buffer circuit 19 can be of multiple stages connected in series.

It is to be understood, however, that although the characteristics and advantages of the present invention have been set forth in the foregoing description, the disclosure is illustrative only, and changes may be made in the arrangement of the parts within the scope of the appended claims.

What is claimed is:

1. An anti-latch-up circuit for protecting a signal-reception device from latch-up possibly triggered in the device, comprising: a voltage source activated separately from a signal-transmission device; a diode connected between said voltage source and an input conductor of said signal-reception device so as to become forward-biased when the over voltage in excess of the voltage of said voltage source is applied to said input conductor; buffer means for providing an output of a first logic level or a second logic level in response to a turn-off or turn-on, respectively, of said voltage source; and an output control means for blocking said signal-transmission device from providing an output when said buffer means provides an output of the first logic level and permitting said signal-transmission device to provide an output when said buffer means provides an output of the second logic level.

2. An anti-latch-up circuit according to claim 1, wherein said signal-transmission device is provided with an output buffer circuit fed with an operating voltage from a power supply and wherein said output control means is connected between said power supply and said output buffer circuit to selectively connect said power supply to said output buffer circuit.

3. An anti-latch-up circuit according to claim 2, wherein said output buffer circuit is a CMOS buffer circuit and said output control means is a p-MOS transistor with a source connected to said power supply, a drain connected to the upper source of said CMOS buffer circuit and a gate connected to the output of said buffer means, and wherein said first logic level is a high level and said second logic level is a low level.

4. An anti-latch-up circuit according to claim 3, wherein said buffer means is provided on the side of said signal-reception device.

5. An anti-latch-up circuit according to claim 3, wherein said buffer means is provided on the side of said signal-transmission device.

6. An anti-latch-up circuit according to claim 3, wherein said buffer means is made up of buffer circuits of multiple stages.

* * * * *